United States Patent
Morita et al.

(10) Patent No.: US 10,388,488 B2
(45) Date of Patent: Aug. 20, 2019

(54) MULTI CHARGED PARTICLE BEAM DRAWING APPARATUS AND MULTI CHARGED PARTICLE BEAM DRAWING METHOD

(71) Applicant: NuFlare Technology, Inc., Yokohama-shi (JP)

(72) Inventors: Hirofumi Morita, Setagaya-ku (JP); Osamu Iizuka, Yokohama (JP); Tsubasa Nanao, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/993,056

(22) Filed: May 30, 2018

(65) Prior Publication Data

US 2018/0350552 A1    Dec. 6, 2018

(30) Foreign Application Priority Data

Jun. 2, 2017   (JP) .................................. 2017-110175

(51) Int. Cl.
*H01J 37/09* (2006.01)
*H01J 37/317* (2006.01)
(Continued)

(52) U.S. Cl.
CPC .............. *H01J 37/045* (2013.01); *H01J 37/09* (2013.01); *H01J 37/20* (2013.01);
(Continued)

(58) Field of Classification Search
CPC .......... H01J 37/045; H01J 37/09; H01J 37/20; H01J 37/3177; H01J 2237/024;
(Continued)

(56) References Cited

U.S. PATENT DOCUMENTS 8,148,702 B2    4/2012   Doering et al.
8,766,216 B2    7/2014   Kawamoto
(Continued)

FOREIGN PATENT DOCUMENTS

JP    2008-235266    10/2008
JP    2010-153858    7/2010
(Continued)

OTHER PUBLICATIONS

Office Action dated Feb. 14, 2019 in Taiwanese Patent Application No. 107117151, with machine English translation.
(Continued)

*Primary Examiner* — Nicole M Ippolito
*Assistant Examiner* — Sean M Luck
(74) *Attorney, Agent, or Firm* — Oblon, McClelland, Maier & Neustadt, L.L.P.

(57) ABSTRACT

In one embodiment, a multi charged particle beam drawing apparatus includes an emitter emitting a charged particle beam, a shaping aperture array in which a plurality of first openings are formed, and which receives irradiation of the charged particle beam in an area including the plurality of first openings, and forms a multi-beam by allowing part of the charged particle beam to pass through a corresponding one of the plurality of first openings, a blanking aperture array in which a plurality of second openings are formed, through each of which a beam is passed, corresponding to part of the multi-beam which has passed through the plurality of first openings, the plurality of second openings each including a blanker that performs blanking deflection of a beam, and a movement controller moving the shaping aperture array or the blanking aperture array, and adjusting space between the shaping aperture array and the blanking aperture array.

9 Claims, 5 Drawing Sheets

(51) Int. Cl.
*H01J 37/20* (2006.01)
*H01J 37/04* (2006.01)

(52) U.S. Cl.
CPC ..... *H01J 37/3177* (2013.01); *H01J 2237/024* (2013.01); *H01J 2237/0435* (2013.01); *H01J 2237/0453* (2013.01); *H01J 2237/24564* (2013.01); *H01J 2237/31774* (2013.01)

(58) Field of Classification Search
CPC ....... H01J 2237/0435; H01J 2237/0453; H01J 2237/24564; H01J 2237/31774
See application file for complete search history.

(56) References Cited

U.S. PATENT DOCUMENTS

| | | | |
|---|---|---|---|
| 2003/0155534 A1* | 8/2003 | Platzgummer | B82Y 10/00 250/492.22 |
| 2009/0200495 A1* | 8/2009 | Platzgummer | B82Y 10/00 250/492.22 |
| 2011/0204253 A1* | 8/2011 | Platzgummer | B82Y 10/00 250/396 R |
| 2016/0111246 A1* | 4/2016 | Matsumoto | H01J 37/045 250/396 R |

FOREIGN PATENT DOCUMENTS

| | | |
|---|---|---|
| JP | 2011-171713 | 9/2011 |
| JP | 2012-253093 | 12/2012 |
| JP | 2015-211040 | 11/2015 |
| JP | 2016-82106 | 5/2016 |
| JP | 2017-98429 A | 6/2017 |
| KR | 10-2003-0029045 A | 4/2003 |

OTHER PUBLICATIONS

Office Action dated May 23, 2019 in Korean Patent Application No. 10-2018-0061593 (with unedited computer generated English translation).

* cited by examiner

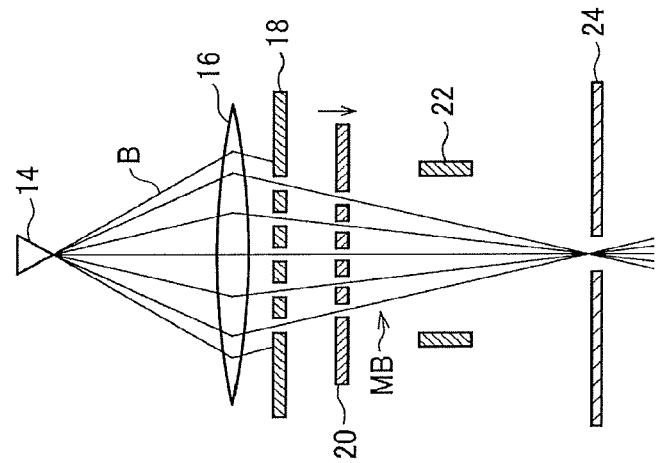
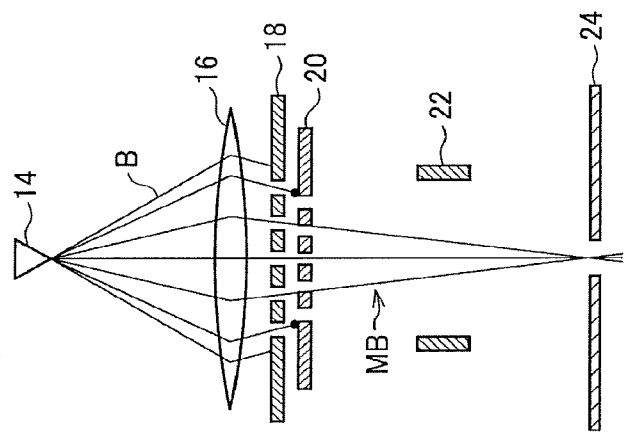

MULTI CHARGED PARTICLE BEAM DRAWING APPARATUS AND MULTI CHARGED PARTICLE BEAM DRAWING METHOD

CROSS REFERENCE TO RELATED APPLICATION

This application is based upon and claims benefit of priority from the Japanese Patent Application No. 2017-110175, filed on Jun. 2, 2017, the entire contents of which are incorporated herein by reference.

FIELD

The present invention relates to a multi charged particle beam drawing apparatus and a multi charged particle beam drawing method.

BACKGROUND

As LSI circuits are increasing in density, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A drawing apparatus using a multi-beam can irradiate with many beams at once, as compared with the case where drawing is performed by a single electron beam, thus the throughput can be significantly improved. In a multi beam drawing apparatus that uses a blanking aperture array, which is one form of multi beam drawing apparatus, for instance, electron beams emitted from an electron gun are passed through a shaping aperture array having multiple openings, and a multi-beam (multiple electron beams) is formed. The multi-beam each passes through a corresponding one of blankers of the blanking aperture array.

The blanking aperture array includes an electrode pair for deflecting a beam individually, and an opening for beam passage between the electrode pair, and one of the electrode pair (blanker) is fixed to the ground potential, and blanking deflection is performed individually on a passing electron beam by switching the other electrode between the ground potential and a potential other than the ground potential. An electron beam deflected by a blanker is shut off, and a sample (a mask) is irradiated with an electron beam not deflected.

As the shaping aperture array is irradiated with a beam, the temperature of the shaping aperture array increases, and an opening pitch is changed due to thermal expansion. When the opening pitch of the shaping aperture array is changed, a problem arises in that the beam pitch of the multi-beam is changed, and some beams cannot pass through the openings of the blanking aperture array, thus part of a beam array, which is to form an image on a sample surface, is lost.

BRIEF DESCRIPTION OF THE DRAWINGS

FIG. 3A is a schematic diagram illustrating passage of beam before the position of a blanking aperture array is adjusted, and FIG. 3B is a schematic diagram illustrating passage of beam after the position of the blanking aperture array is adjusted.

DETAILED DESCRIPTION

In one embodiment, a multi charged particle beam drawing apparatus includes an emitter emitting a charged particle beam, a shaping aperture array in which a plurality of first openings are formed, and which receives irradiation of the charged particle beam in an area including the plurality of first openings, and forms a multi-beam by allowing part of the charged particle beam to pass through a corresponding one of the plurality of first openings, a blanking aperture array in which a plurality of second openings are formed, through each of which a beam is passed, corresponding to part of the multi-beam which has passed through the plurality of first openings, the plurality of second openings each including a blanker that performs blanking deflection of a beam, and a movement controller moving the shaping aperture array or the blanking aperture array, and adjusting space between the shaping aperture array and the blanking aperture array.

Hereinafter, an embodiment of the present invention will be described based on the drawings.

In the embodiment, as an example of a charged particle beam, a configuration using an electron beam will be described. However, the charged particle beam is not limited to an electron beam, and may be an ion beam or the like.

Figure 1:
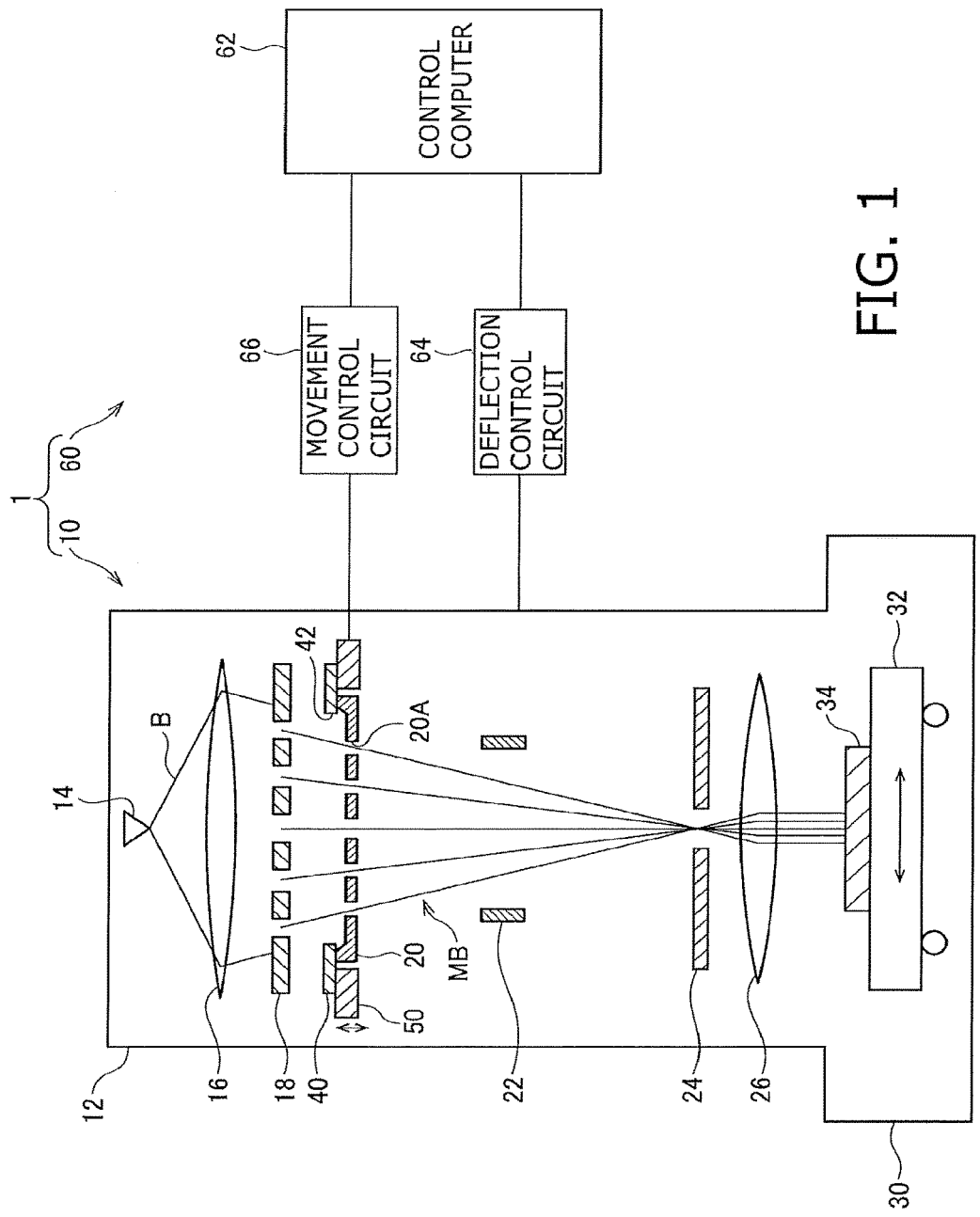
FIG. 1 is a schematic diagram of a multi charged particle beam drawing apparatus according to the present embodiment.

A drawing apparatus 1 illustrated in FIG. 1 includes a drawing unit 10 that draws a desired pattern by irradiating an object, such as a mask or a wafer, with an electron beam, and a controller 60 that controls a drawing operation performed by the drawing unit 10. The drawing unit 10 is an example of a multi beam drawing apparatus having an electron optical column 12 and a drawing chamber 30.

In the electron optical column 12, an electron gun 14, an illumination lens 16, a shaping aperture array 18, a blanking aperture array 20, a deflector 22, a limiting aperture member 24, and an objective lens 26 are disposed. An XY stage 32 is disposed in the drawing chamber 30. A mask blank serving as a target substrate 34, on which a pattern is drawn, is disposed on the XY stage 32.

The target substrate 34 as a drawing target includes, for instance, a wafer and a mask for exposure which prints a pattern on a wafer using a reduced projection exposure device such as a stepper and a scanner utilizing an excimer laser as a light source, or an extreme ultraviolet ray exposure device. In addition, the drawing target substrate includes a mask in which a pattern is already formed. For instance, a Levenson-type mask needs to be drawn twice, thus a second pattern may be drawn on a mask which has been drawn once and processed.

The blanking aperture array 20 is mounted (implemented) on a mounting substrate 40. An opening 42 for passage of an electron beam (multi-beam MB) is formed at a central portion of the mounting substrate 40.

The mounting substrate 40 is mounted on a moving mechanism (raising and lowering mechanism) 50 such as a stage movable up and down, and the moving mechanism 50 includes an actuator such as a motor. The position of the blanking aperture array 20 in an upward and downward direction (beam traveling direction) can be adjusted by moving the moving mechanism 50 up and down. In other words, the moving mechanism 50 can adjust the distance between the shaping aperture array 18 and the blanking aperture array 20 in the beam traveling direction.

Figure 2:
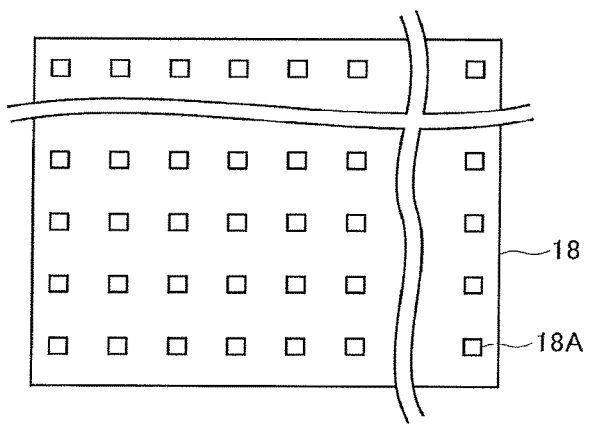
FIG. 2 is a schematic diagram of a shaping aperture array.

As illustrated in FIG. 2, in the shaping aperture array 18, openings (first openings) 18A in m vertical columns x n horizontal columns (m, n ≥2) are formed with a predetermined arrangement pitch. Each of the openings 18A is formed in a rectangle having the same dimensional shape. The shape of the opening 18A may be circular. Part of the electron beam B passes through a corresponding one of these multiple openings 18A, thereby forming the multi-beam MB.

The blanking aperture array 20 is provided under the shaping aperture array 18, and passage holes (second openings) 20A are formed, each of which corresponds to one of the openings 18A of the shaping aperture array 18. The arrangement pitch of the passage holes 20A is narrower than the arrangement pitch of the openings 18A. Blankers (illustration omitted) consisting of a set of two electrodes to be paired are disposed in each of the passage holes 20A. One of the electrodes of the blanker is fixed to the ground potential, and the other electrode is switched between the ground potential and another potential. The electron beam, which passes through each passage hole 20A, is independently deflected by a voltage applied to the blanker. In this manner, the multiple blankers each perform blanking deflection of a corresponding part of the multi-beam MB which has passed through the multiple openings 18A of the shaping aperture array 18.

The controller 60 has a control computer 62, a deflection control circuit 64, and a movement control circuit 66. The deflection control circuit 64 is connected to the blanking aperture array 20 and the deflector 22. The movement control circuit 66 is connected to the moving mechanism 50, and the movement control circuit 66 and the moving mechanism 50 constitute a movement controller.

In the drawing unit 10, an electron optical system includes the illumination lens 16 and objective lens 26. An electron beam B emitted from the electron gun 14 (emitter) is converged by the illumination lens 16 so as to form a crossover at a central hole formed in the limiting aperture member 24, and illuminates the shaping aperture array 18 in its entirety.

The electron beam B passes through multiple openings 18A of the shaping aperture array 18, thereby forming the multi-beam MB. The multi-beam MB each passes through a corresponding one of the blankers of the blanking aperture array 20. Each beam of the multi-beam MB travels to the central hole formed in the limiting aperture member 24 at an angle. Therefore, the beam diameter of the entire multi-beam MB and the beam pitch of the multi-beam MB are gradually reduced after the multi-beam MB passes through the shaping aperture array 18.

The multi-beam MB passes through the blanking aperture array 20 with a pitch which is narrower than the beam pitch formed by the shaping aperture array 18. The multi-beam MB, which has passed through the blanking aperture array 20, travels to the central hole formed in the limiting aperture member 24. Here, an electron beam deflected by a blanker of the blanking aperture array 20 deviates from the position of the central hole of the limiting aperture member 24, and is blocked by the limiting aperture member 24. On the other hand, an electron beam not deflected by the blankers of the blanking aperture array 20 passes through the central hole of the limiting aperture member 24.

In this manner, the limiting aperture member 24 blocks each beam which is deflected by the blankers of the blanking aperture array 20 so as to achieve a beam OFF state. The beam, which has passed through the limiting aperture member 24 in a period from beam ON until beam OFF is achieved, forms the beam for one shot.

The multi-beam MB, which has passed through the limiting aperture member 24, is focused by the objective lens 26 to form a pattern image having a desired reduction ratio. The beams (the entire multi-beam), which have passed through the limiting aperture member 24, are collectively deflected by the deflector 22 in the same direction, and are emitted to respective irradiation positions of the beams on the substrate 34.

Although the deflector 22 is disposed on the upstream side of the limiting aperture member 24 in the optical path in the example of FIG. 1, the deflector 22 may be disposed on the downstream side. When the deflector 22 is disposed on the upstream side of the limiting aperture member 24 in the optical path, the amount of deflection is limited to an amount of ON-beam which can pass through the central hole of the limiting aperture member 24. Also, when the deflector 22 is disposed on the upstream side of the limiting aperture member 24 in the optical path, if the deflector 22 is further provided in two stages, and a deflection route having the position of the limiting aperture member 24 as a so-called fulcrum is formed, the beam can be scanned in a wider area of the substrate 34.

When the XY stage 32 is continuously moved, the irradiation position of each beam is controlled by the deflector 22 so as to follow the movement of the XY stage 32. The XY stage 32 is moved by a stage controller which is not illustrated.

The control computer 62 reads drawing data from a storage device, and performs data conversion processing in multiple stages to generate shot data specific to the device. The amount of irradiation and the coordinates of an irradiation position of each shot are defined in the shot data.

The control computer 62 outputs the amount of irradiation of each shot to the deflection control circuit 64 based on the shot data. The deflection control circuit 64 determines an irradiation time t by dividing the inputted amount of irradiation by a current density. When a corresponding shot is performed, the deflection control circuit 64 applies a deflection voltage to a corresponding blanker of the blanking aperture array 20 so that the blanker is set to beam ON by the irradiation time t.

In addition, the control computer 62 outputs deflection position data to the deflection control circuit 64 so that each beam is deflected to the position (coordinates) indicated by the shot data. The deflection control circuit 64 calculates an amount of deflection, and applies a deflection voltage to the deflector 22. Thus, the multi-beam MB to be shot that time is collectively deflected.

When shaping the multi-beam MB, the shaping aperture array 18 blocks the most of the electron beams B, and thus generates heat and thermally expands. When the arrangement pitch of the openings 18A is changed due to the thermal expansion of the shaping aperture array 18, the beam pitch of the multi-beam MB is also changed. The moving mechanism 50 changes the position of the blanking aperture array 20 in the upward and downward direction according to the change in the beam pitch of the multi-beam MB.

As described above, the multi-beam MB travels to the central hole of the limiting aperture member 24 while narrowing the beam pitch. Even when the beam pitch of the multi-beam MB is changed due to the thermal expansion of the shaping aperture array 18, a position exists, at which the beam pitch corresponds to the arrangement pitch of the passage holes 20A of the blanking aperture array 20. Even when the beam pitch is changed, it is possible for the multi-beam MB to pass through each passage hole 20A of the blanking aperture array 20 by moving the blanking aperture array 20 to such a position.

For instance, as illustrated in FIG. 3A, when the shaping aperture array 18 thermally expands and the beam pitch is increased, some beams cannot pass through the passage holes 20A of the blanking aperture array 20. In this case, as illustrated in FIG. 3B, the blanking aperture array 20 is lowered to increase the space between the shaping aperture array 18 and the blanking aperture array 20, and the beam pitch of the multi-beam MB at a position of the blanking aperture array 20 is narrowed. Consequently, the beam pitch of the multi-beam MB matches the arrangement pitch of the passage holes 20A, and all the beams pass through the passage holes 20A. It is to be noted that illustration of the moving mechanism 50 is omitted in FIGS. 3A and 3B.

The control computer 62 outputs position information on the blanking aperture array 20 to the movement control circuit 66 so that the multi-beam MB passes through the passage holes 20A of the blanking aperture array 20. The movement control circuit 66 calculates an amount of movement of the blanking aperture array 20, and outputs a control signal to the moving mechanism 50. The blanking aperture array 20 is moved downward so that the beam pitch of the multi-beam MB matches the arrangement pitch of the passage holes 20A.

For instance, the control computer 62 determines a variation with time in the beam pitch of the multi-beam MB using the intensity of the electron beam B, the thermal expansion coefficient of a material of which the shaping aperture array 18 is composed, and calculates a preferred position of the blanking aperture array 20 based on an elapsed time from the start of emission of the electron beam B, then outputs information on the position to the movement control circuit 66. The blanking aperture array 20 is gradually lowered (in a stepwise manner) after the start of drawing.

Figure 4:
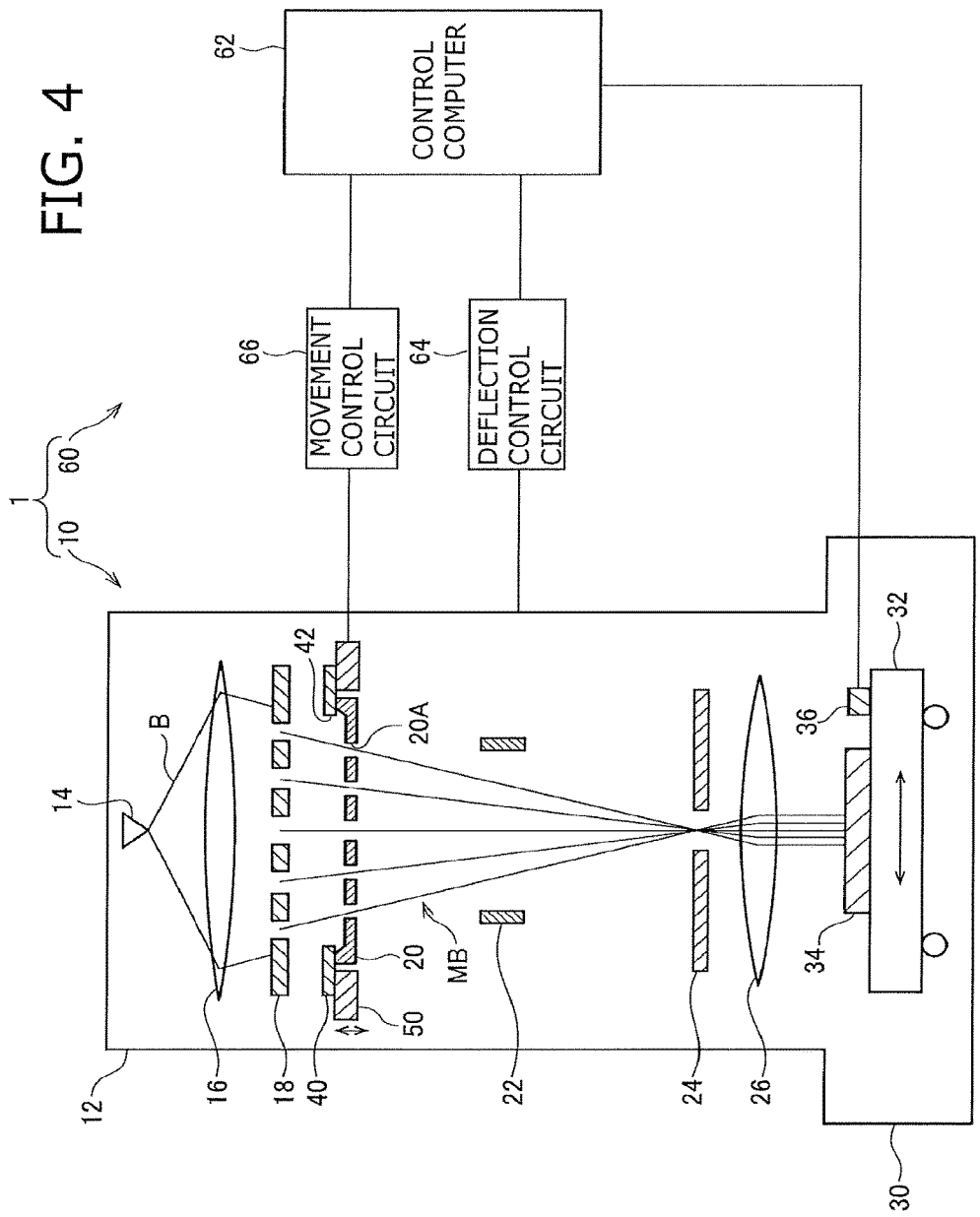
FIG. 4 is a schematic diagram of a multi charged particle beam drawing apparatus according to a modification.
Figure 5:
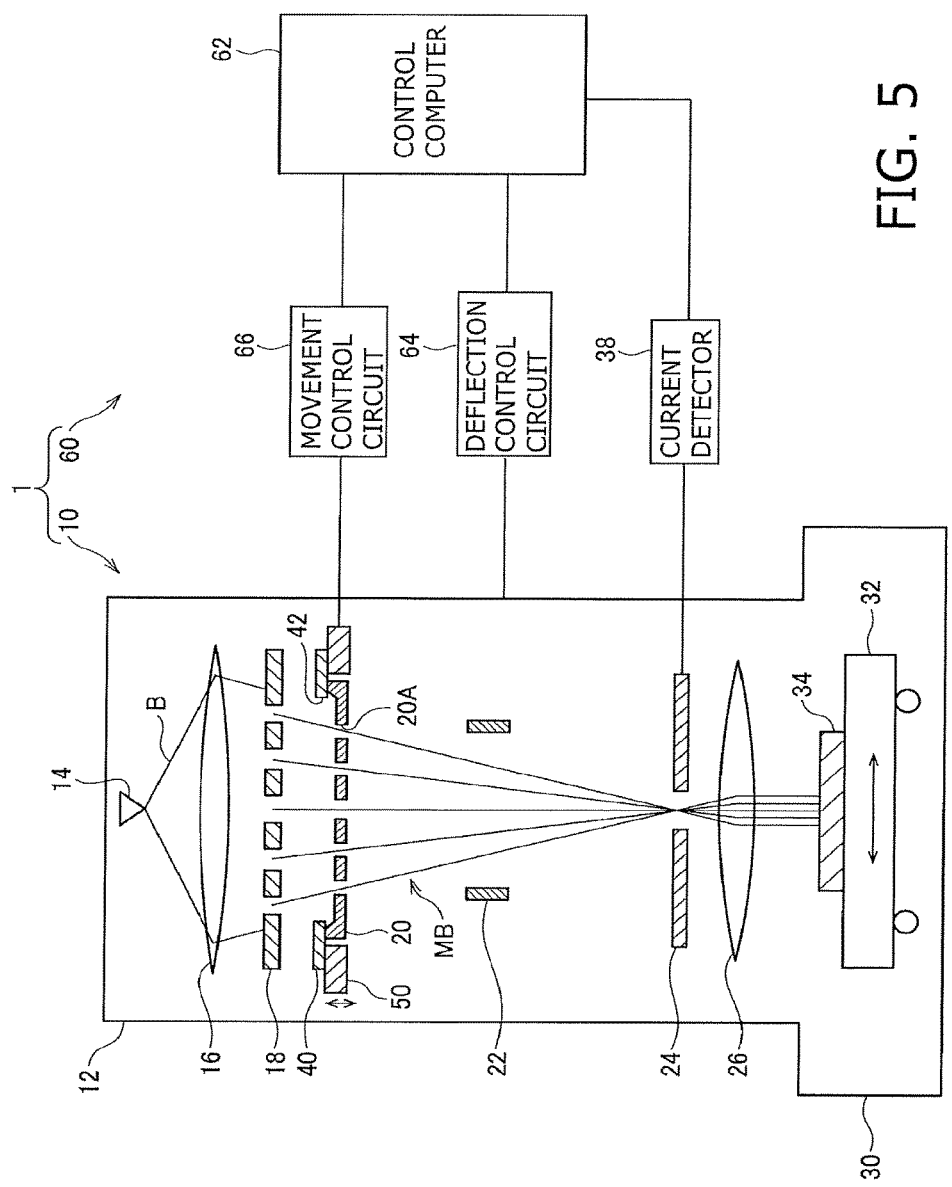
FIG. 5 is a schematic diagram of a multi charged particle beam drawing apparatus according to a modification.

A preferred position of the blanking aperture array 20 may be determined by measurement without performing such a calculation. For instance, as illustrated in FIG. 4, the movement control circuit 66 may send a signal for slightly moving position upward or downward to the control computer 62 while measuring the total beam current which passes through the blanking aperture array 20 by a current detector 36 installed in the XY stage 32, and detects a position at which the amount of current is the highest, and may move the blanking aperture array 20 to the position. The location at which a current is detected may be anywhere as long as the location is on the downstream side of the blanking aperture array 20, and for instance, as illustrated in FIG. 5, the limiting aperture member 24 may be utilized as a detection electrode, and an absorbed current may be detected by the current detector 38.

In this manner, even when the opening pitch of the shaping aperture array 18 is changed, the multi-beam MB can pass through the passage holes 20A of the blanking aperture array 20 by adjusting the position of the blanking aperture array 20 in the beam traveling direction, and loss in a beam array which forms an image on the substrate 34 can be prevented from occurring.

Although an example has been described, in which the blanking aperture array 20 is moved upward and downward by the moving mechanism 50 in the above-mentioned embodiment, the position of the blanking aperture array 20 may be fixed, and the shaping aperture array 18 may be moved upward and downward.

For instance, when the shaping aperture array 18 thermally expands and the beam pitch of the multi-beam MB is increased, the shaping aperture array 18 is raised. The space between the shaping aperture array 18 and the blanking aperture array 20 is increased, the beam pitch of the multi-beam MB at the position of the blanking aperture array 20 is narrowed. Consequently, the beam pitch of the multi-beam MB matches the arrangement pitch of the passage holes 20A, and all the beams pass through the passage holes 20A.

Although the dimensions of beam or the amount of current which passes through the shaping aperture array 18 may be changed by moving the shaping aperture array 18 upward and downward, the amount of change is extremely small. For example, in the case where the shaping aperture array 18 is made of silicon having a thermal expansion coefficient of about $2.5 \times 10^{-6}$, the rate of change of the beam size is about $1/4000$ even when there is a temperature rise of 100 degrees Celsius. Although the array width of beam which forms an image on the substrate 34 is also changed with this ratio, the change of this order can be addressed by finely adjusting the shot position at the time of drawing. Alternatively, the change in the array width of beam can be addressed by forming the objective lens 26 as an optical system including two or more stages, and adjusting the magnification.

Various types of electronic circuits are mounted on the blanking aperture array 20, and when the amount of heat generation in operation of the electronic circuits is large, the blanking aperture array 20 may thermally expand, and the arrangement pitch of the passage holes 20A may be increased. In such a case, the beam pitch of the multi-beam MB and the arrangement pitch of the passage holes 20A can be matched by raising the blanking aperture array 20 or lowering the shaping aperture array 18 to decrease the space between the shaping aperture array 18 and the blanking aperture array 20.

In the embodiment, a configuration has been described, in which the illumination lens 16 is provided above the shaping aperture array 18, the electron beam B converged by the illumination lens 16 illuminates the shaping aperture array 18, and the entire multi-beam MB is gradually decreased in beam diameter after passing through the shaping aperture array 18. However, the electron beam B emitted from the electron gun 14 and diffused may illuminate the shaping aperture array 18, the entire multi-beam MB is gradually increased in beam diameter after passing through the shaping aperture array 18, and the multi-beam MB may be converged by an illumination lens provided below the blanking aperture array 20. In this case, the arrangement pitch of the passage holes 20A of the blanking aperture array 20 is wider than the arrangement pitch of the openings 18A of the shaping aperture array 18.

In such a configuration, when the shaping aperture array 18 thermally expands and the beam pitch of the multi-beam MB is increased, the beam pitch of the multi-beam MB and the arrangement pitch of the passage holes 20A can be matched by raising the blanking aperture array 20 or lowering the shaping aperture array 18 to decrease the space between the shaping aperture array 18 and the blanking aperture array 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam drawing apparatus comprising:
    an emitter emitting a charged particle beam;
    a shaping aperture array in which a plurality of first openings are formed, and
    which receives irradiation of the charged particle beam in an area including the plurality of first openings, and forms a multi-beam by allowing part of the charged particle beam to pass through a corresponding one of the plurality of first openings;
    a blanking aperture array in which a plurality of second openings are formed, through each of which a beam is passed, corresponding to part of the multi-beam which has passed through the plurality of first openings, the plurality of second openings each including a blanker that performs blanking deflection of a beam; and
    a movement controller moving the shaping aperture array or the blanking aperture array, and adjusting space between the shaping aperture array and the blanking aperture array,
    wherein an arrangement pitch of the plurality of second openings is narrower than another arrangement pitch of the plurality of first openings, and
    wherein when a beam pitch of the multi-beam is increased, space between the shaping aperture array and the blanking aperture array is increased.

2. The multi charged particle beam drawing apparatus according to claim 1, further comprising:
    a controller calculating a position of the blanking aperture array in which the multi-beam passes through the plurality of second openings, based on an intensity of the charged particle beam emitted from the emitter, a thermal expansion coefficient of a material of which the shaping aperture array is composed, and an elapsed time from a start of emission of the charged particle beam,
    wherein the movement controller moves the blanking aperture array to the calculated position.

3. The multi charged particle beam drawing apparatus according to claim 1, further comprising:
    a current detector detecting a beam current which passes through the blanking aperture array,
    wherein the movement controller moves the blanking aperture array to a position at which a result of detection by the current detector is maximum.

4. The multi charged particle beam drawing apparatus according to claim 3, wherein
the current detector is provided on a stage on which a drawing target substrate is disposed.

5. The multi charged particle beam drawing apparatus according to claim 3, further comprising:
    a limiting aperture member blocking the beam deflected by the blanker of the blanking aperture array,
    wherein the current detector detects an absorbed current on the limiting aperture member.

6. A multi charged particle beam drawing method comprising:
    emitting a charged particle beam;
    forming a multi-beam by allowing part of the charged particle beam to pass through a corresponding one of a plurality of first openings by using a shaping aperture array in which the plurality of first openings are formed, and receiving irradiation of the charged particle beam in an area including the plurality of first openings;
    performing blanking deflection on corresponding beams of the multi-beam by using a plurality of blankers, each of the blankers is disposed in each of a plurality of second openings formed in a blanking aperture array, through each of which a beam is passed, corresponding to part of the multi-beam which has passed through the plurality of first openings; and
    adjusting space between the shaping aperture array and the blanking aperture array, by moving the shaping aperture array or the blanking aperture array,
    wherein an arrangement pitch of the plurality of second openings is narrower than another arrangement pitch of the plurality of first openings, and
    wherein when a beam pitch of the multi-beam is increased, space between the shaping aperture array and the blanking aperture array is increased.

7. The multi charged particle beam drawing method according to claim 6,
    wherein when the arrangement pitch of the plurality of second openings is increased, space between the shaping aperture array and the blanking aperture array is decreased.

8. The multi charged particle beam drawing method according to claim 6, further comprising:
    calculating a position of the blanking aperture array in which the multi-beam passes through the plurality of second openings, based on an intensity of the charged particle beam emitted from an emitter, a thermal expansion coefficient of a material of which the shaping aperture array is composed, and an elapsed time from a start of emission of the charged particle beam; and
    moving the blanking aperture array to the calculated position.

9. The multi charged particle beam drawing method according to claim 6, further comprising:
    detecting a beam current which passes through the blanking aperture array; and
    moving the blanking aperture array to a position at which a detected beam current is maximum.

* * * * *